(12) United States Patent
Choi

(10) Patent No.: US 10,312,300 B2
(45) Date of Patent: Jun. 4, 2019

(54) ORGANIC LIGHT EMITTING DISPLAY DEVICE

(71) Applicant: LG Display Co., Ltd., Seoul (KR)

(72) Inventor: Bong-Ki Choi, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 66 days.

(21) Appl. No.: 15/797,961

(22) Filed: Oct. 30, 2017

(65) Prior Publication Data

US 2018/0122866 A1    May 3, 2018

(30) Foreign Application Priority Data

Oct. 31, 2016  (KR) .......................... 10-2016-0143982

(51) Int. Cl.
*H01L 27/32* (2006.01)
*C09J 163/00* (2006.01)
*G06F 3/041* (2006.01)
*H01L 51/00* (2006.01)

(52) U.S. Cl.
CPC .......... *H01L 27/323* (2013.01); *C09J 163/00* (2013.01); *G06F 3/0412* (2013.01); *H01L 27/3276* (2013.01); *H01L 51/0035* (2013.01); *H01L 51/0097* (2013.01); *C09J 2203/326* (2013.01); *C09J 2463/00* (2013.01); *G06F 2203/04102* (2013.01); *G06F 2203/04103* (2013.01); *H01L 2227/326* (2013.01); *H01L 2251/5338* (2013.01)

(58) Field of Classification Search
CPC ............... H01L 27/323; H01L 27/3276; H01L 51/0035; H01L 51/0097; H01L 2227/326; H01L 2251/5338; C09J 163/00; C09J 2203/326; C09J 2463/00; G06F 3/0412; G06F 2203/04102; G06F 2203/04103
See application file for complete search history.

(56) References Cited

U.S. PATENT DOCUMENTS

| 2015/0102323 A1* | 4/2015 | Koshihara | H01L 27/3272 257/40 |
| 2015/0102326 A1* | 4/2015 | An | H01L 51/5256 257/40 |
| 2015/0102351 A1* | 4/2015 | Kimura | H01L 29/78678 257/71 |
| 2015/0102376 A1* | 4/2015 | Toya | H01L 27/322 257/98 |

* cited by examiner

*Primary Examiner* — Sejoon Ahn
(74) *Attorney, Agent, or Firm* — Birch, Stewart, Kolasch & Birch, LLP

(57) ABSTRACT

Disclosed is an organic light emitting display device provided in view of scattering of base materials and lowering of reliability during cutting, when the base materials are formed on both glass substrates and then the glass substrates are removed so as to achieve slimming and flexibility of the device. The organic light emitting display device includes an anisotropic pattern in a dead area of a base material, wherein the dead area of the base material has regions that protrude from an active area by differing amounts.

15 Claims, 9 Drawing Sheets

No removal of glass

ORGANIC LIGHT EMITTING DISPLAY DEVICE

This application claims the priority benefit of Korean Patent Application No. 10-2016-0143982, filed on Oct. 31, 2016, the disclosure of which is hereby incorporated by reference in its entirety.

BACKGROUND OF THE INVENTION

Field of the Invention

Embodiments of the present invention relate to an organic light emitting display device, and more particularly, to an organic light emitting display device which solves problems, such as scattering of base materials and lowering of reliability during cutting, when the base materials are formed on both glass substrates and then the glass substrates are removed so as to achieve slimming and flexibility of the device.

Discussion of the Related Art

As the information age has arrived, the field of displays visually expressing electrical information signals has rapidly developed and, in order to satisfy such a trend, various flat display devices having excellent performance, such as thin thickness, light weight and low power consumption, have been researched as a substitute for conventional cathode ray tubes (CRTs).

As representative examples of flat display devices, there are liquid crystal displays (LCDs), plasma display panels (PDPs), field emission displays (FEDs), and organic light emitting diode (OLED) displays, etc.

Thereamong, an organic light emitting diode display requiring no separate light source has been considered as effective to achieve compactness of a device and clear color expression.

The organic light emitting diode display includes self-luminous elements, such as organic light emitting diodes, in sub-pixels and each sub-pixel displays an image by operation of the organic light emitting diode. Further, organic light emitting diodes may be used as self-luminous elements in a lighting apparatus as well as a display device and, thus, development of organic light emitting diodes has been spotlighted in the field of lighting recently. Moreover, organic light emitting diodes do not require a separate light source unit and may be easily used in a flexible display device or a transparent display device.

Flexible display devices are being developed to a type which has a small thickness and is foldable. Further, a type of flexible display device provided with a touchscreen to display an image so as to satisfy user's direct input, has been proposed.

If a flexible display device provided with a touchscreen is implemented, an array process is carried out on glass substrates and then the glass substrates having a large thickness are removed so as to achieve slimming and flexibility. During the removal process of the glass substrates, particles may be generated around scribing lines and thus cause damage to the flexible display device.

FIGS. 1A and 1B are cross-sectional views illustrating problems occurring when glass substrates are removed, in a related art method of manufacturing an organic light emitting display device.

As by example shown in FIGS. 1A and 1B, the related art organic light emitting display device is manufactured by forming a first base material 11 on a first glass substrate and forming a thin film transistor array and light emitting diode array 12 on the first base material 11, forming a second base material 21 on a second glass substrate 20 provided opposite the first glass substrate 10 and forming a touch electrode array 22 on the second base material 21, disposing the thin film transistor array and light emitting diode array 12 and the touch electrode array 22 so as to face each other, and bonding the thin film transistor array and light emitting diode array 12 and the touch electrode array 22 by an adhesive layer 30 interposed therebetween.

Thereafter, through laser irradiation, the second glass substrate 20 is removed and then the first glass substrate 10 is removed. In this instance, the respective glass substrates 20 and 10 are removed from interfaces between the glass substrates 20 and 10 and the base materials 21 and 11. In this instance, if there is a region in which the adhesive layer 30 is not applied due to spreading degree differences of the adhesive layer 30 among regions, as by example shown in FIG. 1A, as the second glass substrate 20 is removed, such a region does not have supporting force, the second base material 21 may scatter during the removal process and thus the scattered particles of the second base material 21 may serve as foreign substances in the device.

Further, as by example shown in FIG. 1B, if an excessively large amount of an adhesive is applied and thus an adhesive layer 30a has a larger area than the second base material 21, a part of the adhesive layer 30a contacts the edge of the second glass substrate 20 during a bonding and pressing process and, thus, it may be difficult to completely remove the second glass substrate 20 from the second base material 21 only through laser irradiation.

SUMMARY OF THE INVENTION

Accordingly, the embodiments of the present invention are directed to an organic light emitting display device that substantially obviates one or more problems due to limitations and disadvantages of the related art.

An object of the present invention is to provide an organic light emitting display device which address scattering of base materials and lowering of reliability during cutting, when the base materials are formed on both glass substrates and then the glass substrates are removed so as to achieve slimming and flexibility of the device. The present invention controls spreading area of an adhesive by using an anisotropic pattern.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a first base material including a first active area and a first dead area located outside the first active area and provided with an array pad electrode part and touch assistant pad electrode parts in the first dead area at a periphery of a first side of the active area, an array in the first active area of the first base material, a second base material overlapping the first active area and the first dead area except for the array pad electrode part the second base material having a second active area and a second dead area located outside of the second active area, a touch electrode array facing the array and touch electrode parts corresponding to the touch assistant pad electrode parts, the touch electrode array being on the second base material, an adhesive layer between the array and the touch electrode array, an anisotropic conductive film between the touch assistant pad electrode parts and the touch electrode parts, and an anisotropic pattern in the second dead area of the second base material adjacent to the array pad electrode part.

The anisotropic pattern may be spaced apart from the anisotropic conductive film.

Outside a first side of the second active area, a first region of the second dead area of the second base material with the touch electrode parts may protrude from a boundary of the second active area by a first width, and a second region of the second dead area of the second base material without the touch electrode parts may protrude from the boundary of the second active area by a second width smaller than the first width. Further, the anisotropic pattern may be located within the second width from the boundary.

The organic light emitting display device may further include a dummy anisotropic pattern located in the second dead area.

The anisotropic conductive film and the anisotropic pattern may include the same epoxy resin.

The anisotropic conductive film, the adhesive layer and the anisotropic pattern may be provided on a formation surface of the second base material.

The viscosity of the anisotropic pattern may be 10 or more times the viscosity of the adhesive layer.

The anisotropic pattern and the anisotropic conductive film may have a greater thickness than that of the adhesive layer.

The spreadability of the adhesive layer may be blocked by the anisotropic pattern and the dummy anisotropic pattern located at an edge of the second base material.

The adhesive layer may contact the anisotropic pattern or the dummy anisotropic pattern.

It is to be understood that both the foregoing general description and the following detailed description of the present invention are by example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1A:
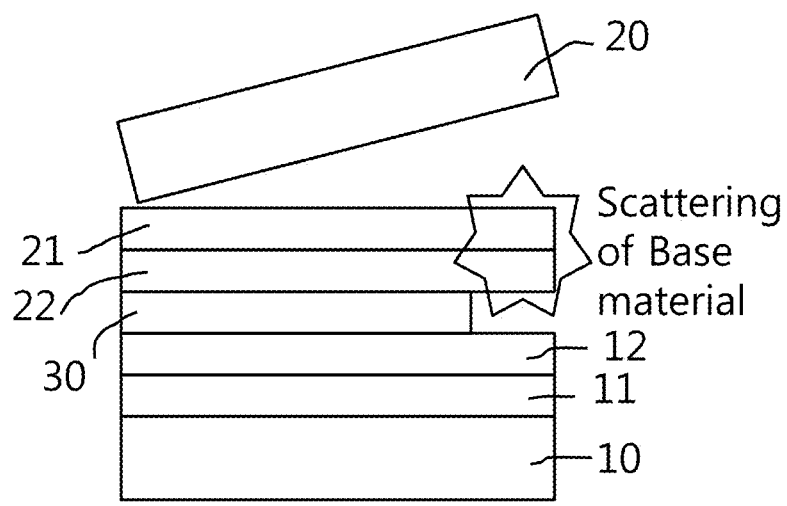
FIGS. 1A and 1B are cross-sectional views illustrating problems occurring when glass substrates are removed, in a related art method of manufacturing an organic light emitting display device.
Figure 1B:
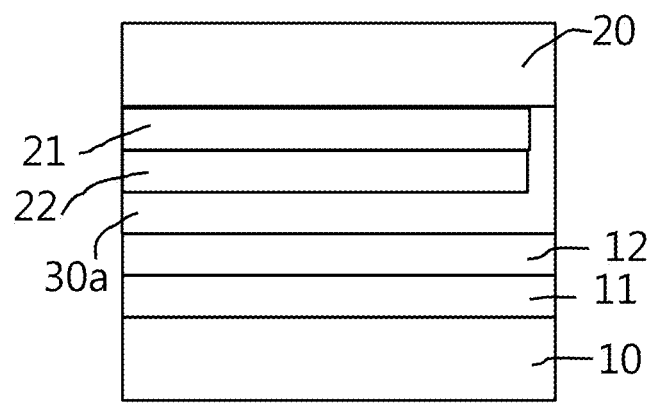

Reference will now be made in detail to the embodiments of the present invention, examples of which are illustrated in the accompanying drawings.

However, the disclosure of the invention is not limited to the embodiments set forth herein and may be variously modified. It should be understood, however, that there is no intent to limit the invention to the particular forms disclosed, but on the contrary, the invention is to cover all modifications, equivalents, and alternatives falling within the spirit and scope of the invention as defined by the claims. Sizes, thicknesses, etc. illustrated in the drawings to describe the embodiments of the present invention are by example and thus are not limited to the drawings. In the drawings, the same or similar elements are denoted by the same reference numerals even though they are depicted in different drawings.

In the following description of the present invention, a detailed description of known functions and configurations incorporated herein will be omitted when it obscures the subject matter of the present invention.

It will be understood that when an element is referred to as being "on" or "above" another element, the element may be located just on the other element or intervening elements may also be present between the two elements. On the other hand, when an element is referred to as being "just on" or "directly on" another element, no intervening element is present between the two elements.

It will be understood that spatial relational terms "below", "beneath", "lower", "above", "upper", etc. may be used to easily describe relations between one element or device and other elements or devices in the drawings. It will be understood that spatial relational terms may include different directions of an element during use or operation, in addition to a direction of the element illustrated in the drawings. For example, if an element illustrated in the drawings is reversed, the element described as being located "below" or "beneath" another element may be located "above" the other element. Therefore, an exemplary term "below" may include both a downward direction and an upward direction.

Terms used in the following description serve only to describe the embodiments and do not limit the present invention. In addition, when a singular element is stated, the element may be provided in plural, unless stated otherwise. In the following description of the embodiments, the terms "comprise" and/or "comprising" will be interpreted as indicating the presence of other elements, steps, operations and/or devices, unless stated otherwise, and do not exclude presence of the corresponding elements, steps, operations and/or devices.

Figure 2:
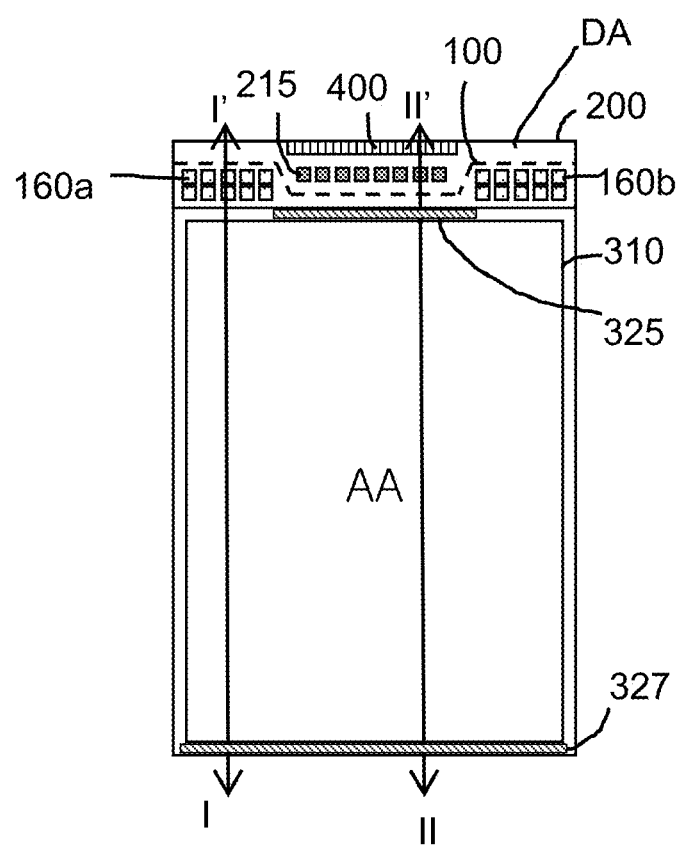
FIG. 2 is a plan view of an organic light emitting display device according to an embodiment of the present invention.
Figure 3A:
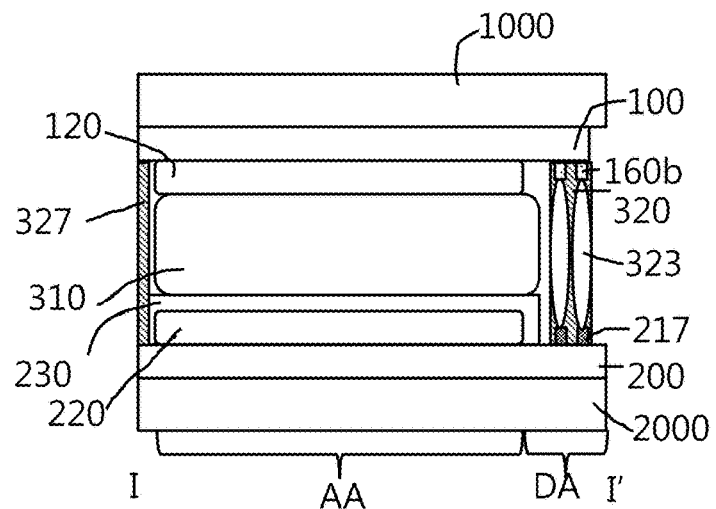
FIGS. 3A and 3B are cross-sectional view of FIG. 2, taken along line I-I' and line respectfully.
Figure 3B:
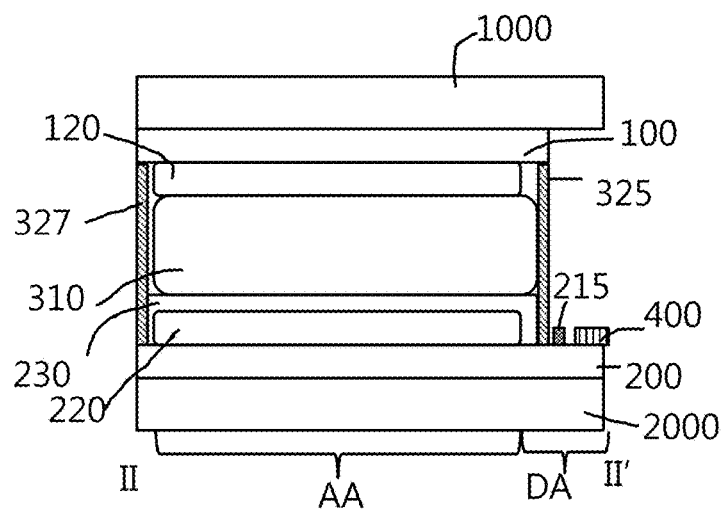

FIG. 2 is a plan view of an organic light emitting display device according to an embodiment of the present invention, and FIGS. 3A and 3B are cross-sectional view of FIG. 2, taken along line I-I' and line II-II'.

As by example shown in FIGS. 2 to 3B, the organic light emitting display device according to an embodiment of the present invention includes a first base material 200 including an active area AA, and a dead area DA located outside the active area AA and provided with an array pad electrode part 2150 and touch assistant pad electrode parts 2170 (see, e.g., FIG. 6A) formed at the dead area DA outside of a first side of the active area AA, an array 220 provided in the active area AA of the first base material 200, a second base material 100 overlapping the active area AA and the dead area DA except for the array pad electrode part 2150, a touch electrode array 120 facing the array 220 and touch electrode parts 1600 (see e.g., FIG. 6B) corresponding to the touch assistant pad electrode parts 2170, provided on the second base material 100, an adhesive layer 310 located between the array 220 and the touch electrode array 120, an anisotropic conductive film 320 located between the touch assistant pad electrode parts 2170 and the touch electrode parts 1600, and an anisotropic pattern 325 located in a region of the dead area of the second base material 100 adjacent to the array pad electrode part 2150.

The organic light emitting display device according to an embodiment of the present invention is applicable to a structure in which base materials are respectively formed on glass substrates, an array and a touch electrode array are formed on the corresponding base materials, the array and the touch electrode array are bonded by an adhesive layer interposed therebetween and, then, the glass substrates are removed. Particularly, the anisotropic pattern 325 having high viscosity and low spreadability are located around the scribing lines and, thus, when the scribing lines are cut, the anisotropic pattern 325 having designated viscosity may prevent the base materials from scattering. Further, the anisotropic pattern 325 having controllable spreadability is located outside the adhesive layer 310 having high spreadability and, thus, removal of the glass substrates may be normally carried out. Further, both base materials 100 and 200 have sufficient adhesiveness by the adhesive layer 310 or the anisotropic film 320 interposed therebetween and, thus, generation of non-bonded regions may be minimized and sufficient reliability in the bonding process and the glass substrate removal process may be acquired.

In this instance, the anisotropic pattern 325 may be spaced apart from the anisotropic conductive film 320. The anisotropic pattern 325 and the anisotropic conductive film 320 include an epoxy resin having the same viscosity, but the anisotropic conductive film 320 further includes conductive balls to conductively connect pad electrodes. Since, if the anisotropic pattern 325 includes conductive balls, the conductive balls are in danger of running to the adjacent active area AA and thus reacting to the active area AA, the anisotropic pattern 325 may be spaced apart from the anisotropic conductive film 320 including the conductive balls and thus maintain insulation.

Differently from the first base material 200 having a rectangular shape, one side of the second base material 100 provided with the pad electrode parts 1600 on a glass substrate is patterned and thus the second base material 100 has a different shape from the first base material 200.

In this instance, regions of the dead area DA of the second base material 100 located outside a first side of the active area AA, in which the touch electrode parts 1600 are located, protrude from the boundary of the active area AA by a first width L1, and a region of the dead area DA, in which no touch electrode parts 1600 are located, protrudes from the boundary of the active area AA by a second width L2 smaller than the first width L1. In this instance, the anisotropic pattern 325 may be located within the second width L2, i.e., the region of the dead area DA without the touch electrode parts 1600. By locating the anisotropic pattern 325 having low spreadability in the region of the dead area DA having a relatively small width without the touch electrode parts 1600, the anisotropic pattern 325 may prevent the adhesive layer 310 in such a region from protruding outwards from the second base material 100 during the pressing process while bonding the first and second base materials 200 and 100.

That is, the organic light emitting display device according to an embodiment of the present invention may solve problems caused by spreading the adhesive layer 310 after bonding of the first and second base materials 200 and 100. In such a structure in which a touchscreen (the touch electrode array 120) is provided in the second base material 100, the anisotropic pattern 325 having a novel structure is provided and thus prevents unwanted spreading of the adhesive layer 320 in the region of the dead area DA provided with the anisotropic pattern 325.

The second base material 100 further includes a dummy anisotropic pattern 327 in a region of the dead area DA located outside a second side of the active area AA opposite the first side. The dummy anisotropic pattern 327 is located at a side of the second base material 100 without the touch electrode parts 1600 and may be formed throughout the length of the second side of the second base material 100. In this instance, the dummy anisotropic pattern 327 may have a greater length then that of the anisotropic pattern 325, and the anisotropic pattern 325 and the dummy anisotropic pattern 327 may be formed of the same epoxy resin-based material having high viscosity.

Further, the anisotropic conductive film 320, the adhesive layer 310, the anisotropic pattern 325 and the dummy anisotropic pattern 327 may be provided on a formation surface of the second base material 100.

In this instance, the viscosity of the anisotropic pattern 325 and the dummy anisotropic pattern 327 may be 10 or more times the viscosity of the adhesive layer 310.

Further, the anisotropic pattern 325 and the anisotropic conductive film 320 may have a greater thickness than the adhesive layer 310. The anisotropic conductive film 320 should have a greater stiffness than the adhesive layer 310 so as to connect touch electrodes 160a or 160b of the touch electrode parts 1600 and touch assistant pad electrodes 217 of the touch assistant pad electrode parts 2170 located on the second and lower base materials 100 and 200 while supporting the touch electrodes 160a or 160b and the touch assistant pad electrodes 217, and the anisotropic pattern 325 is formed of the same material as the anisotropic conductive film 320 except for the conductive balls and thus has the same thickness as the anisotropic conductive film 320 and the same spreadability control characteristics as the anisotropic conductive film 320. In this instance, spreadability of the adhesive layer 310 may be prevented by the anisotropic pattern 325 and the dummy anisotropic pattern 327 located at the edge of the second base material 100. In this instance, the adhesive layer 310 may meet the anisotropic pattern 325 or the dummy anisotropic pattern 327 via the pressing process and the hardening process while bonding.

In this instance, reference numeral 400 indicates a driver integrated circuit (IC) which is located at the edge of the first base material 200, and is conductively connected to the array pad electrodes 215 but does not overlap the second base material 100. The driver IC 400 controls driving of the array 220 and the touch electrode array 120.

Hereinafter, a method of manufacturing an organic light emitting display device according to an embodiment of the present invention will be described in detail.

Figure 4:
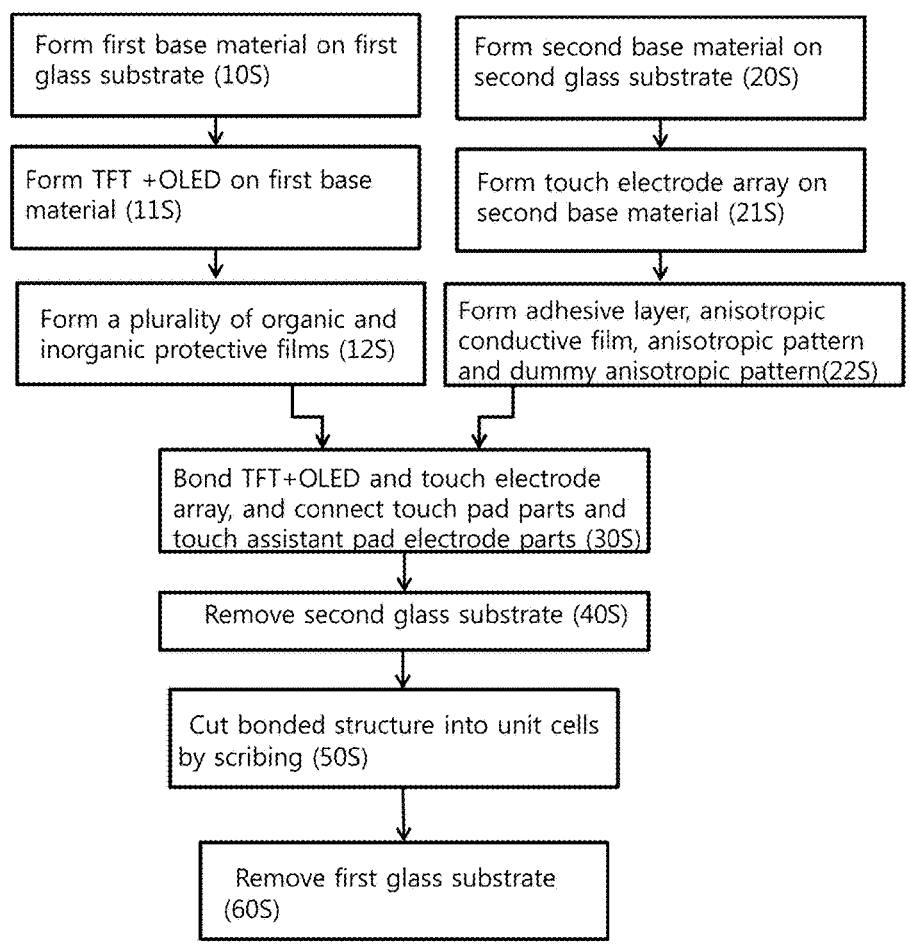
FIG. 4 is a flowchart illustrating a method of manufacturing an organic light emitting display device according to an embodiment of the present invention.
Figure 5:
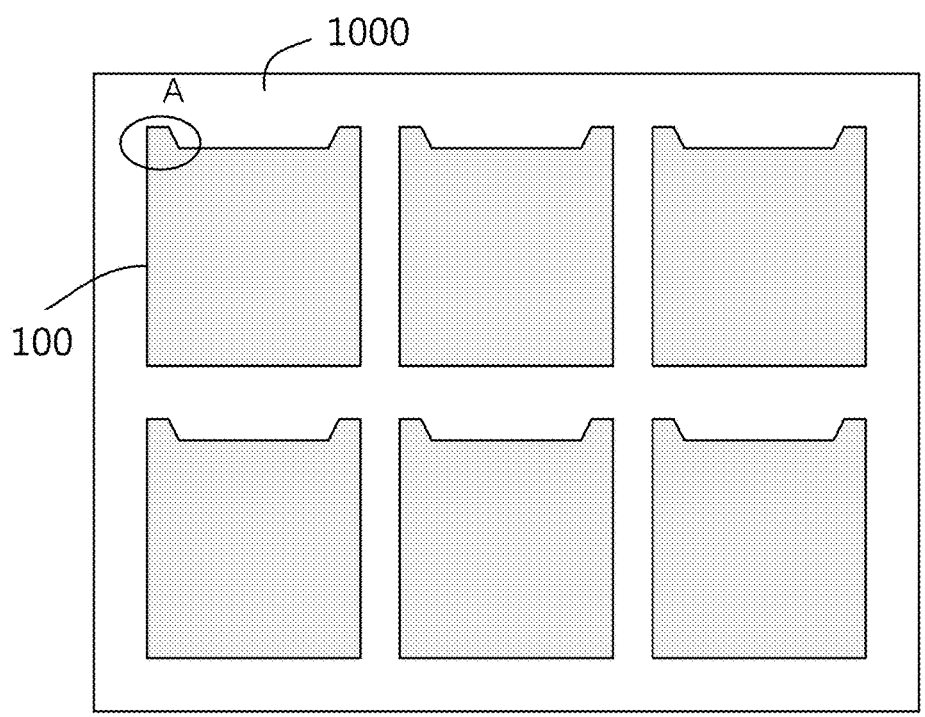
FIG. 5 is a plan view of a second glass substrate of the organic light emitting display device according to an embodiment of the present invention.
Figure 6A:
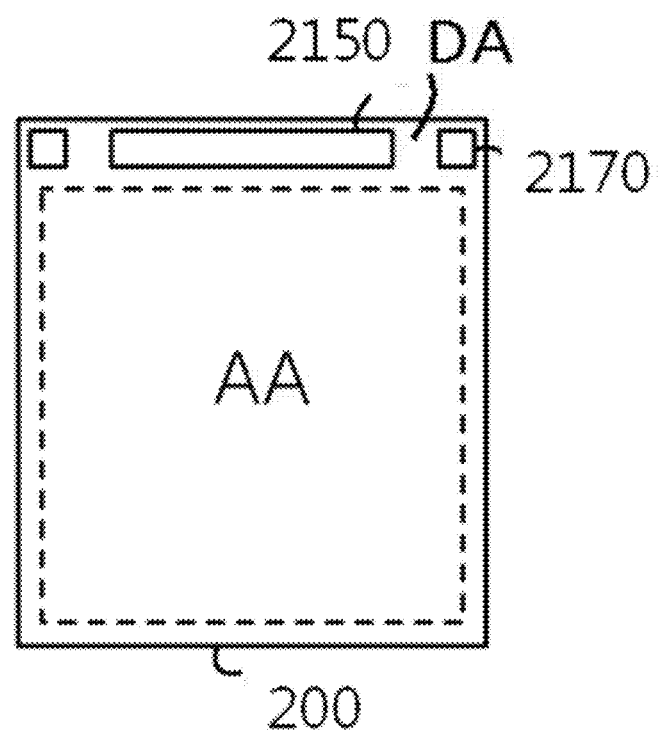
FIGS. 6A and 6B are plan views of first and second glass substrates of the organic light emitting display device according to an embodiment of the present invention.
Figure 6B:
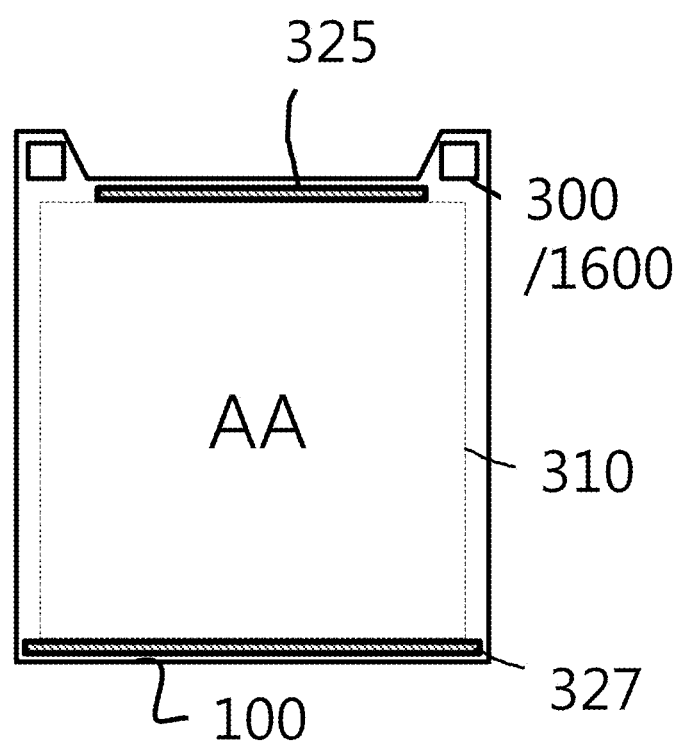

FIG. 4 is a flowchart illustrating a method of manufacturing an organic light emitting display device according to an embodiment of the present invention, FIG. 5 is a plan view of a second glass substrate of the organic light emitting display device according to an embodiment of the present invention, and FIGS. 6A and 6B are plan views of first and second glass substrates of the organic light emitting display device according to an embodiment of the present invention.

As by example shown in FIGS. 4 to 6B, a first glass substrate is prepared and then a first base material 200 is applied to the first glass substrate (Operation 10S).

Thereafter, a thin film transistor array is formed in each of respective TFT base material unit cells on the first base material 200, as by example shown in FIG. 6A. In each unit cell, the first base material 200 includes an active area AA located at the center thereof and a dead area located outside the active area AA, one side of the dead area has a relatively large area, and an array pad electrode part 2150 including a plurality of array pad electrodes are formed at the side of the dead area. In this instance, touch assistant pad electrode parts 2170 are provided at both sides of the array pad electrode part 2150 and connected to touch pad parts 1600 of a touch base material unit cell which will be bonded thereto. The first base material 200 is not individually separated into the respective touch base material unit cells during the process of forming the thin film transistor array and only regions for touch base material unit cells are divided from each other. That is, during the process of forming the thin film transistor array, the first base material 200 is integrally formed on the first glass substrate, i.e., a mother substrate having a plurality of TFT base material unit cells, and the thin film transistor array is individually formed in each of the respective TFT base material unit cells. Thereafter, an organic light emitting diode array is formed on the thin film transistor array (Operation 11S). In this instance, the active area AA is divided into a plurality of sub-pixels, and thin film transistors and organic light emitting diodes are connected in each sub-pixel in the respective TFT base unit cells. In this instance, an array 220 includes the thin film transistors and the organic light emitting diodes.

Thereafter, a plurality of organic and inorganic protective films 230 sufficient to cover the array 220 including the thin film transistors and the organic light emitting diodes are formed so as to have a function of preventing moisture permeation (Operation 12S).

Thereafter, a second glass substrate 1000 is prepared, a sacrificial layer is formed on the second glass substrate 1000, a flexible film is applied thereto, and then a second base material 100, both side parts of the upper side of which protrude, is formed in each of touch base material unit cells through patterning via a photolithography process (Operation 20S).

Thereafter, as by example shown in FIG. 6B, a touch electrode array 120 is formed in the active area of the second base material 100 in each of the touch base material unit cells, and touch pad parts 1600 are formed in some regions of the dead area outside the active area (Operation 21S). That is, when the touch electrode array 120 and the touch pad parts 1600 are formed, the second base material 100 is located on the second glass substrate 1000.

A flexible film forming the first base material 200 and the second base material 100 is an organic film formed of colorless photoacryl or polyimide having a thin thickness of about 0.5 μm to 10 μm. Such an organic film is not a separate adhesive film but is a thin film grown by applying a material to a glass substrate, and has a much smaller thickness than a separate plastic film and thus assists flexibility of a flexible display device. Further, the first and second base materials 200 and 100 may be formed of different materials, i.e., the first base material 200 may be formed of colored polyimide having high heat resistance and the second base material 100 may be formed of colorless polyimide.

Thereafter, a material forming an adhesive layer 310 is applied to the active area AA of the second base material 100, an anisotropic conductive film 320 is applied to regions of the second base material 100 in which the touch electrode parts 1600 are located, and an anisotropic pattern 325 is applied to a region of the dead area of the upper side of the second base material 100 in which no touch electrode parts are located. Further, in the same process, a dummy anisotropic pattern 327 is applied to the dead area of the lower side opposite the upper side of the second base material 100 provided with the touch electrode parts 1600. The adhesive layer 310, the anisotropic conductive film 320, the anisotropic pattern 325 and the dummy anisotropic pattern 327 are formed of flowable materials having viscosity during a formation process thereof and then the flowable materials are hardened during a subsequent hardening process using heat or UV light after bonding.

Thereafter, after the touch electrode array 120 and the array 220 including the thin film transistors and the organic light emitting diodes are located so as to face each other, the touch electrode array 120 and the array 220 are bonded to each other face-to-face using the material forming the adhesive layer 310 by applying a designated pressure thereto (Operation 30S). Thereby, the touch electrode parts 1600 (regions A) and the touch assistant pad electrode parts 2170 are conductively connected to each other through the anisotropic conductive film 320, and the first and second base materials 200 and 100 are bonded to each other at the edge of the second base material 100 by the anisotropic pattern 325 and the dummy anisotropic pattern 327. In order to reduce the number of operations in the process, the anisotropic conductive film 320, the adhesive layer 310, the anisotropic pattern 325 and the dummy anisotropic pattern 327 are formed of materials which reacts to heat or UV light in common.

In this instance, in addition to the anisotropic conductive film 320, the adhesive layer 310 also includes an epoxy resin. However, the epoxy resin for the adhesive layer 310 is not the same as the epoxy resin for the anisotropic conductive film 320, and the epoxy resin for the anisotropic conductive film 320 has viscosity which is 10 or more times the viscosity of the epoxy resin for the adhesive layer 310. In this instance, the anisotropic conductive film 320 and the anisotropic pattern 325 and the dummy anisotropic pattern 327, which are formed of the same material as the anisotropic conductive film 320 except for conductive balls, serve to control spreadability of the material forming the adhesive layer 310 when pressure is applied to the material forming the adhesive layer 310 during the bonding process. Viscosity of such a material may be controlled by selecting a kind of epoxy and adjusting the molecular weight of a binder, and be controlled by selecting a required hardener, as circumstances require.

Thereafter, the second glass substrate 1000 is removed through laser irradiation (Operation 40S).

Thereafter, the bonded structure is cut into the TFT base material unit cells by scribing, as by example shown in FIG. 6A (Operation 50S), and the first glass substrate is removed through laser irradiation on the first glass substrate (Operation 60S). Thereby, a bonded panel of each unit cell is formed.

After removal of the second glass substrate 1000 and the first glass substrate, the bonded panel is configured such that a region of the second base material 100 corresponding to the array pad electrode part 2150 of the first base material 200 is opened and thus the second base material 100 has a smaller size than the first base material 200, as by example shown in FIG. 2, and FIGS. 3A and 3B.

Hereinafter, characteristics of the anisotropic conductive film and the adhesive layer used in the organic light emitting display device according to an embodiment of the present invention will be described.

Figure 7:
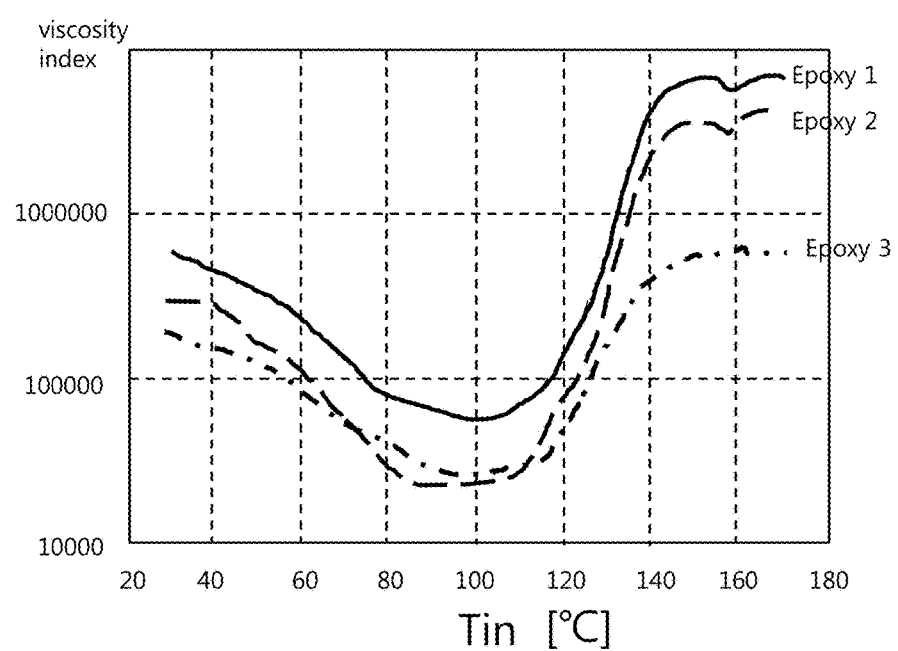
FIG. 7 is a graph representing viscosity of an anisotropic conductive film according to temperature.
Figure 8:
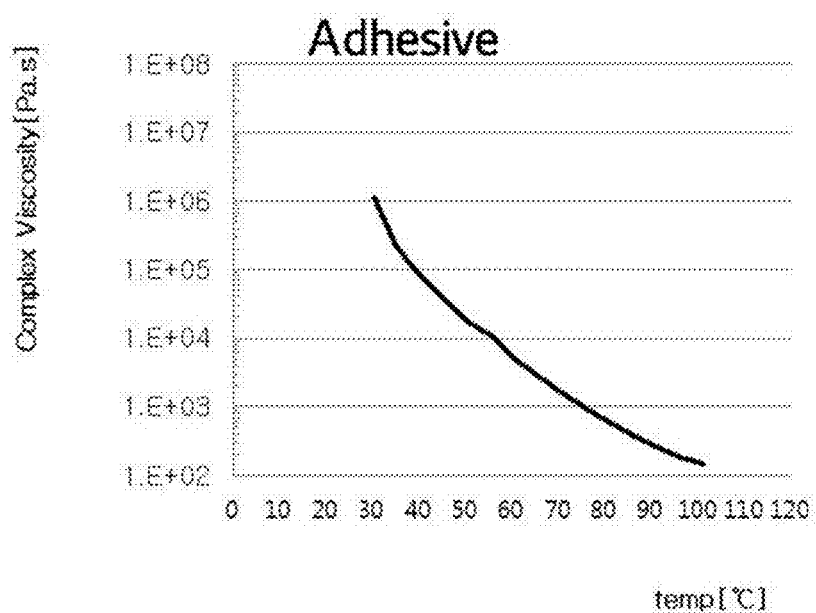
FIG. 8 is a graph representing viscosity of an adhesive layer according to temperature.

FIG. 7 is a graph representing viscosity of the anisotropic conductive film according to temperature, and FIG. 8 is a graph representing viscosity of the adhesive layer according to temperature.

As by example shown in FIG. 7, the anisotropic pattern and the dummy anisotropic pattern formed of the same epoxy resin as the anisotropic conductive film have viscosity varying according to temperature change. In more detail, it may be confirmed that a viscosity index of the epoxy resin is lowered from 1,000,000 to 12,000, i.e. by $1/80$, when a temperature is changed from 0° C. to 100° C., and is instead raised at temperatures above 100° C.

In this instance, epoxy 1, epoxy 2, and epoxy 3 curves represent different kinds of epoxy resins used as the anisotropic conductive film, and these epoxy resins individually have different viscosity index values but show the same temperature tendency.

As by example shown in FIG. 8, it may be confirmed that a viscosity index of a material of the adhesive layer is gradually lowered when a temperature is changed from room temperature to 100° C. The adhesive layer has a viscosity index which is $1/1000$ to $1/10$ of the viscosity index of the anisotropic conductive film at any temperature and, thereby, it may be expected that, when heat of the same conditions is applied to the adhesive layer or the anisotropic conductive film, for example and after the bonding process of the organic light emitting display device, viscosity of the anisotropic conductive film, the anisotropic pattern and the dummy anisotropic pattern is higher than the viscosity of the adhesive layer in any environment.

The organic light emitting display device according to an embodiment of the present invention may prevent scattering of the base materials at the edge during a process of removing the glass substrates and stably execute the process of removing the glass substrates, using high viscosity and spreadability control of the anisotropic pattern and the dummy anisotropic pattern located at regions outside the adhesive layer.

As apparent from the above description, an organic light emitting display device according to an embodiment of the present invention has the effects noted below.

An anisotropic material is located at the edge of a surface of a base material, on which a touchscreen is formed, and thus controls spreadability of an adhesive layer. Therefore, the organic light emitting display device prevents scattering of a base material during removal of a glass substrate from the outer surface of the touchscreen and prevents excessive spreading of the adhesive layer, and thus the glass substrate is easily removed. Therefore, reliability of the device may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device comprising:
   a first base material including a first active area and a first dead area located outside the first active area, and including an array pad electrode part and touch assistant pad electrode parts in the first dead area at a periphery of a first side of the first active area;
   an array on the first active area of the first base material;
   a second base material overlapping the first active area and the first dead area except for the array pad electrode part, the second base material having a second active area and a second dead area located outside the second active area;
   a touch electrode array facing the array and touch electrode parts corresponding to the touch assistant pad electrode parts, the touch electrode array being on the second base material;
   an adhesive layer between the array and the touch electrode array;
   an anisotropic conductive film between the touch assistant pad electrode parts and the touch electrode parts; and
   an anisotropic pattern in the second dead area of the second base material adjacent to the array pad electrode part,
   wherein the anisotropic pattern is spaced apart from the anisotropic conductive film, wherein: a first region of the second dead area of the second base material with the touch electrode parts protrudes from a boundary of the second active area by a first width; and a second region of the second dead area of the second base material without the touch electrode parts protrudes from the boundary of the second active area by a second width smaller than the first width, and wherein the anisotropic pattern is located within the second width from the boundary.

2. The organic light emitting display device according to claim 1, further comprising a dummy anisotropic pattern opposite to the anisotropic pattern and located in the second dead area.

3. The organic light emitting display device according to claim 1, wherein the anisotropic conductive film and the anisotropic pattern include the same epoxy resin.

4. The organic light emitting display device according to claim 1, wherein the anisotropic conductive film, the adhesive layer, and the anisotropic pattern are provided on a surface of the second base material.

5. The organic light emitting display device according to claim 3, wherein a viscosity of the anisotropic pattern is 10 or more times a viscosity of the adhesive layer.

6. The organic light emitting display device according to claim 1, wherein the anisotropic pattern and the anisotropic conductive film have a greater thickness than that of the adhesive layer.

7. The organic light emitting display device according to claim 1, wherein a spreadability of the adhesive layer is blocked by the anisotropic pattern and the dummy anisotropic pattern located at an edge of the second base material.

8. The organic light emitting display device according to claim 7, wherein the adhesive layer contacts the anisotropic pattern or the dummy anisotropic pattern.

9. An organic light emitting display device comprising:
   a first base material including an array pad electrode part, touch assistant pad electrode parts, and an array; a second base material overlapping the first base material, and having an active area and a dead area located outside the active area;

a touch electrode array and touch electrode parts on the second base material;

an adhesive layer between the array and the touch electrode array;

an anisotropic conductive film between the touch assistant pad electrode parts of the first base material and the touch electrode parts of the second base material; and an anisotropic pattern in the dead area of the second base material, wherein the dead area of the second base material has regions that protrude from the active area by differing amounts, wherein: a first region among the regions of the dead area of the second base material with the touch electrode parts protrudes from a boundary of the active area by a first width; and a second region among the regions of the dead area of the second base material without the touch electrode parts protrudes from the boundary of the active area by a second width smaller than the first width, and wherein the anisotropic pattern is located within the second width from the boundary.

10. The organic light emitting display device according to claim 9, further comprising a dummy anisotropic pattern opposite to the anisotropic pattern and located in the dead area.

11. The organic light emitting display device according to claim 10, wherein the adhesive layer contacts the anisotropic pattern or the dummy anisotropic pattern.

12. The organic light emitting display device according to claim 9, wherein the anisotropic conductive film and the anisotropic pattern include the same epoxy resin.

13. The organic light emitting display device according to claim 9, wherein the anisotropic conductive film, the adhesive layer, and the anisotropic pattern are provided on a surface of the second base material.

14. The organic light emitting display device according to claim 9, wherein a viscosity of the anisotropic pattern is 10 or more times a viscosity of the adhesive layer.

15. The organic light emitting display device according to claim 9, wherein the anisotropic pattern and the anisotropic conductive film have a greater thickness than that of the adhesive layer.

* * * * *